United States Patent
Berger et al.

(10) Patent No.: US 7,065,160 B2
(45) Date of Patent: Jun. 20, 2006

(54) METHOD AND APPARATUS FOR CORRECTING THE PHASE OF A CLOCK IN A DATA RECEIVER

(75) Inventors: Matthias Berger, Burgthann (DE); Claus Dorschky, Eckental (DE); Herbert Haunstein, Dormitz (DE); Frank Kunz, Nuemberg (DE); Christoph Schulien, Altdorf bei Nuemberg (DE); Konrad Sticht, Eschenbach (DE)

(73) Assignee: Lucent Technologies Inc., Murray Hill, NJ (US)

(*) Notice: Subject to any disclaimer, the term of this patent is extended or adjusted under 35 U.S.C. 154(b) by 751 days.

(21) Appl. No.: 10/042,594

(22) Filed: Jan. 9, 2002

(65) Prior Publication Data

US 2003/0128779 A1    Jul. 10, 2003

(30) Foreign Application Priority Data

Jan. 22, 2001 (EP) .................................. 01300523

(51) Int. Cl.
*H03D 1/00* (2006.01)
*H04L 27/06* (2006.01)

(52) U.S. Cl. ..................... 375/340; 375/316; 375/239; 375/286; 329/304

(58) Field of Classification Search ................. 375/340
See application file for complete search history.

(56) References Cited

U.S. PATENT DOCUMENTS

| 3,820,051 | A | * | 6/1974 | Puckette | ....................... 327/23 |
| 4,308,500 | A | * | 12/1981 | Avins | .......................... 327/12 |
| 4,535,459 | A | | 8/1985 | Hogge | |
| 6,034,554 | A | | 3/2000 | Francis | |

FOREIGN PATENT DOCUMENTS

| EP | 0 585 090 A2 | 8/1993 |
| WO | WO 00/38324 | 6/2000 |

OTHER PUBLICATIONS

J. D. H. Alexander, "Clock Recovery From Random Binary Signals", *Electronic Letters,* vol. 11, (Oct. 1975), pp. 541-542.

* cited by examiner

*Primary Examiner*—Chieh M. Fan
*Assistant Examiner*—Erin M. File

(57) ABSTRACT

A method for correcting the phase of a clock in a data receiver which receives a data flow representing different signal levels with logical high and low signal values and signal transitions positioned therebetween, wherein the positions of such signal transitions between respective two adjacent logical signal values are evaluated for correcting the phase of the clock. The position of a signal transition between a first pair of signal values on one level (11) or a second pair of signal values on the other level (00) is weighted stronger in the evaluation then the positions of signal transitions between adjacent single signal values (1,0) of different signal levels.

1 Claim, 2 Drawing Sheets

ONE BIT PERIOD
— HALF RATE TRANSITIONS

METHOD AND APPARATUS FOR CORRECTING THE PHASE OF A CLOCK IN A DATA RECEIVER

FIELD OF INVENTION

The invention relates to a method for correcting the phase of a clock in a data receiver and to an apparatus for carrying out the method particularly in an early-late phase detector.

BACKGROUND OF INVENTION

Data receivers often receive distorted signals, particularly in long distance transmission systems at high bit rates, for instance over standard signal fibre cables. Here, inter-symbol interference (ISI), chromatic dispersion (CD), polarisation mode dispersion (PMD), transmitter chirp, extinction ratio, fibre non-linearity may occur and result in the so-called reduced eye opening. The incoming data at the receiver can be considered as a varying analogue signal from which a timing or clock information can be recovered which is necessary to sample the incoming signal at appropriate intervals to recover the data. This function is commonly accomplished with the aid of a phase locked loop (PLL) which includes a phase detector (PD), a loop filter (LF) and a voltage controlled oscillator (VCO). A well-known phase detector is the early-late phase detector described by Alexander. This detector generates output signals which indicate the direction of the phase deviation relative to a correct timing. These output signals are termed "up" and "down" control signals. The incoming signal which carries the data flow has logical signal values which generally are termed 1 or 0. Between adjacent logical signal values a signal transition may happen. The Alexander phase detector samples two adjacent logical signal values and the signal transition therebetween, these sampled signals being termed "a sample group" in this application. If the sample values which may be 1 or 0 are different among adjacent logical signal values, sampling the signal transition between these adjacent logical signal values may result in a 1 or 0. If the first logical signal value of a group and the signal transition value are equal and differ from the value of the second logical signal value, the clock is too early, and if the signal transition value and the second logical signal value are equal, the clock is too late. In the first case the clock is to slow down and in the second case to speed up. The output signal of the phase detector is converted by the loop filter and fed to the voltage controlled oscillator for controlling the output clock frequency thereof. The clock is fed back to the phase detector and determine the sampling intervals by the position of the rising (or falling) edges of the clock frequency signal. Statistically up and down control signals will happen equally so that the sampling phase controlled by the clock frequency will be correctly adapted to the incoming signal carrying the data flow.

If there are large signal distortions in the incoming data flow, it becomes difficult to correct the phase of the clock in the data receiver, since the performance of the early-late phase detector is degraded and the phase locked loop fails to lock. This is true especially for partial response channels, where differential group delay occurs approximately at the bit transition, the phase detector does not succeed in finding a stable sampling clock phase.

SUMMARY OF THE INVENTION

An object of the invention is to correct the phase of a clock in a data receiver also if the incoming signals of the data flow are strongly distorted.

The invention is based on the principle that the logical high and low signal values that represent the bits in the data flow follow randomly, i.e. an incoming signal with sufficient duration statistically will have sections where a pair of high signal values is followed by a pair of low signal values or a pair of low signal values is followed by a pair of high signal values. These signal sections commonly are distorted to a lesser degree, and the chance to find the signal transition correctly is enhanced. The invention makes use of this circumstance and weights such signal transitions stronger than for all findings of other signal transitions.

With the invention, also an improved phase detector is created. An early-late phase detector of prior art is modified in that the output stage is enabled to produce two different output signals, one for standard operation and another with a scaling or amplification factor, for the signal transitions between pairs of signal values of different levels.

The invention can be implemented at low additional costs to that of a standard early-late phase detector. Circuitry may be realised in digital technology. Only one gate level is needed for high speed applications. The gate circuitry can be implemented with low costs and on small size. Testing of the circuitry is uncritical, because no feed back loops are needed in the gate circuitry. The behaviour is deterministic and this can be validated.

With the invention, locking of the receiver on the incoming data flow is improved also if the incoming signals are distorted. The output signal of the early-late phase detector is weighted and by setting the weight factor on an appropriate value (for instance 4) a trade-off between fast acquisition, jitter of the receive phase locked loop and stable lock can be found.

DESCRIPTION OF THE PREFERRED EMBODIMENTS

Figure 2:
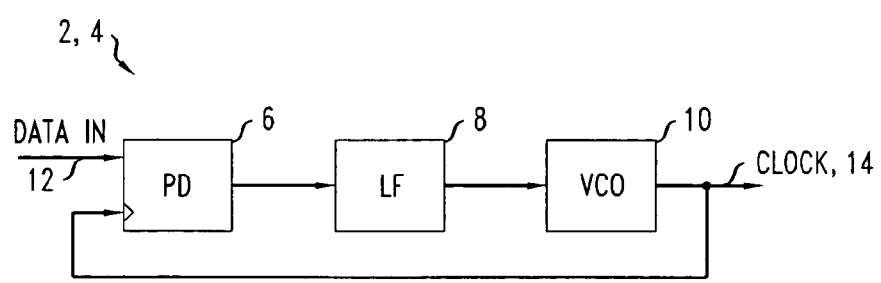
FIG. 2 is a block diagram of a receive phase locked loop.

FIG. 2 shows the phase locked loop 4 in a data receiver 2 including a phase detector PD 6, a loop filter LF 8 and an analogue voltage controlled oscillator VCO 10. The incoming data flow 12 is indicated at "data in". The output 14 of the voltage controlled oscillator VCO 10 is indicated with "clock". The circuit functions to sample the incoming data 12 with the clock frequency and to recover timing information for the voltage controlled oscillator VCO 10 to generate the correct clock 14 frequency with the correct phase for sampling the incoming signal 12.

Figure 3:
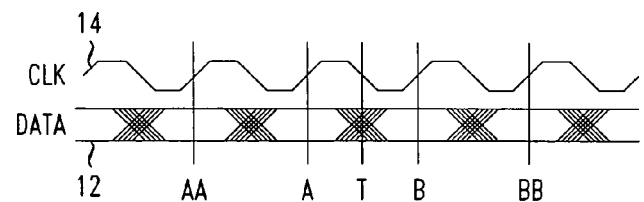
FIG. 3 is a signal and clock scheme for showing phase detection timing.

FIG. 3 shows controlled by the clock signal 14 CLK sampling times AA, A, T, B and BB for the incoming data flow 12. Times AA, A, B and BB are in intervals of one bit, whereas time T is at signal transition between two adjacent bits at times A and B in the data flow 12. The signal samples at A, T and B form an "inner sample group" as used in a conventional early-late phase detector and the signal samples AA, A, T, B, BB form an "enlarged sample group". Samples AA and A form a first signal sample pair and samples B and BB form a second signal sample pair.

Figure 4:
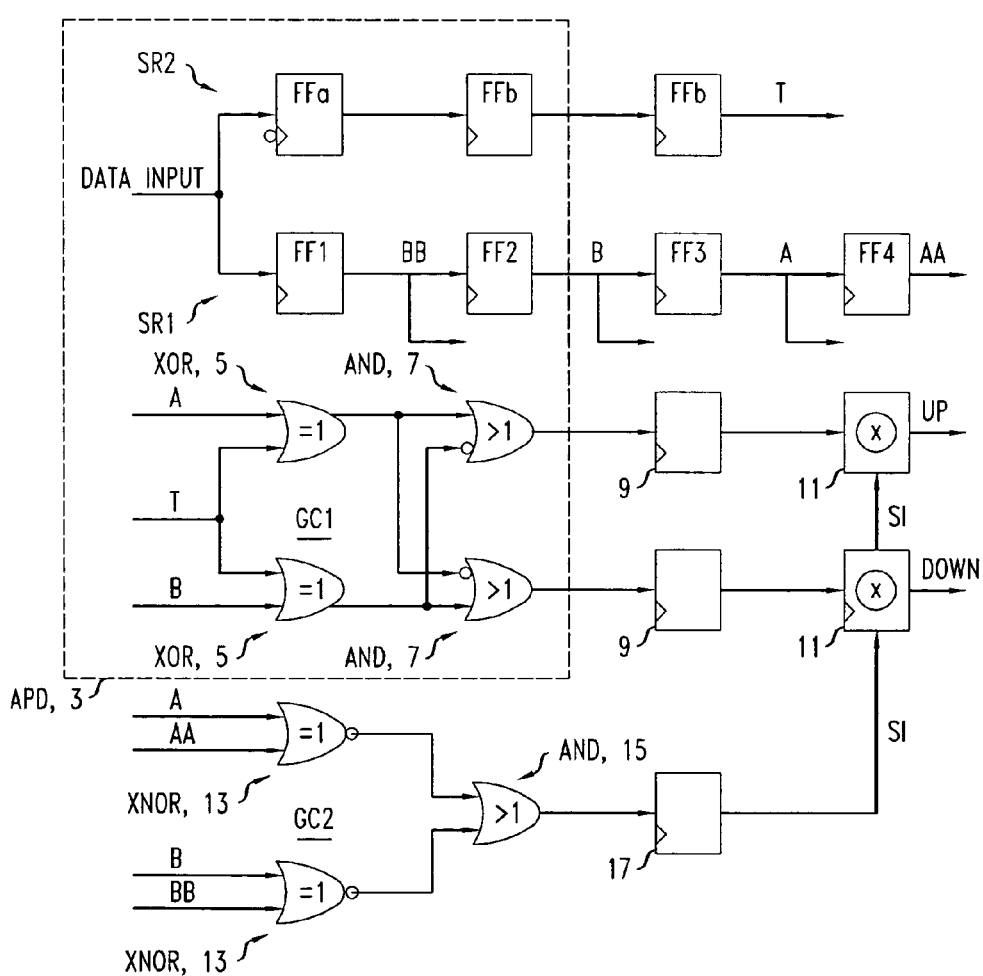
FIG. 4 is a block diagram of an early-late phase detector improved according to the invention.

FIG. 4 shows the circuitry for correcting the phase of the clock 14 in the data receiver 2. The incoming data 12 are connected to a first shift register SR1 and a second shift register SR2. Shift register SR1 has four flip flops FF1, FF2, FF3, FF4 in a row which form stages or cells which receive the samples indicated in FIG. 3 and shift them from stage to stage to the timing of the clock. Shift register SR2 has three flip flops FFa, FFb, FFc in a row which form stages or cells of the row. The first cell in the row is addressed by the falling edge of the clock pulse so as to sample an expected signal transition T and intermediately store it and shift it to the output of the shift register SR2 in the same time period as sample probe A appears at the output of the third cell of shift register SR1.

The phase detector 6 also includes a first gate circuit GC1 and a second gate circuit GC2. Gate circuit GC1 is configured in two rows where each row comprises an Exclusive-or (XOR) gate 5 as input stage, an AND gate 7 having one inverted input as the second stage, a flip flop 9 as the third stage and a weighting output stage 11 which delivers a control output to be delivered to the loop filter LF 8 and hence to the voltage controlled oscillator VCO 10 for controlling same. The output signal of the upper row is termed "UP" and of the lower row "DOWN". UP means shifting the edges of the clock CLK to the left in FIG. 3 and DOWN means shifting to the right hand side. The output stages of the gate circuit GC1, each comprises a second input (SI) from gate Circuit GC2 which can switch the output stage into a condition of multiplying the output signal UP or DOWN by a scaling or amplification factor x which has a value between 1 and 4. Further circuitry (not shown) may evaluate the quality of the incoming data signal and deliver a setting signal to set the value of factor x at an appropriate level.

Gate circuit GC2 has a pair of Exclusive-nor (XNOR) gates 13 at the input, an AND gate 15 connected to the outputs of the XNOR gates and a flip flop 17 as output stage provided for timing purposes and being connected to the output stages of the first gate circuit GC1.

The conventional early-late phase detector of Alexander is indicated at APD 3 in FIG. 4, wherein the symbols BB and B are to be exchanged for B and A. The operation of the detector APD 3 can best be understood from table 1 wherein the signal samples are taken at times A, T and B. The signal value can be "high" indicated by 1, or "low" indicated by 0.

The signal transition at time T may have a value which is nearer to low, then the sample value is 0, or nearer to high, then the sample value is 1. There are patterns of the signal samples which produce an output for controlling the voltage controlled oscillator VCO 10, and patterns from which no information for controlling the VCO 10 can be derived. (Output UP=0, DOWN=0).

Figure 1:
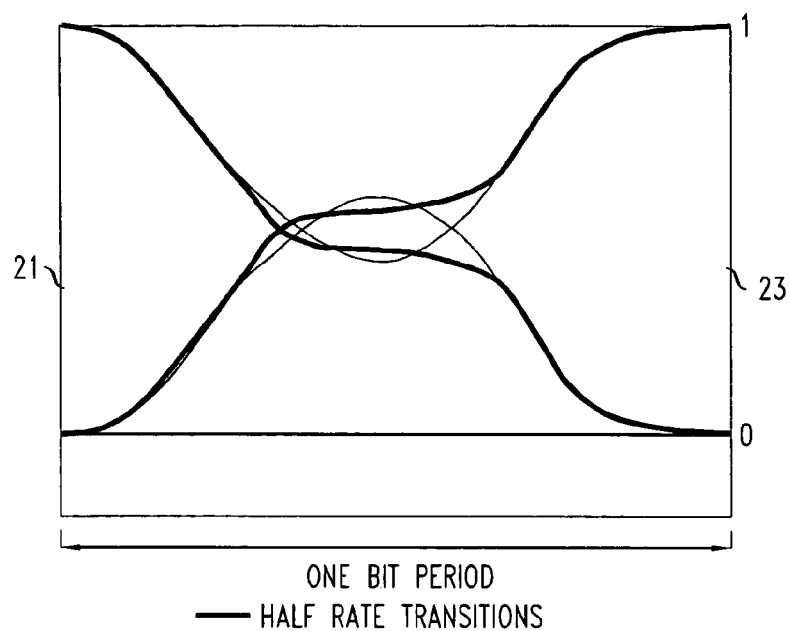
FIG. 1. is an eye opening diagram for distorted signals.

The latter pattern includes the signal samples 010 and 101 which mean highly distorted signals. Such signals are shown schematically in FIG. 1 with the thin line thickness. Distortions may also lead to patterns of signal samples which produce outputs with the wrong direction of phase correction. In such situations, the phase detector does not succeed in finding a stable sampling clock phase.

Signals carrying a data flow may show data bit patterns with a pair of 11 and a pair of 00 and a transition between such pairs. Also data bit patterns 00 followed by 11 are possible. In signal sections with such bit pairs, the transitions between the pairs may be termed "half rate transitions". These half rate transitions produce Eye openings 21,23 shown at the left hand side and right hand side of FIG. 1. Finding these half rate transitions and using them for clock control will result in a good phase correction. The novel features of the early-late phase detector of the invention lead to these excellent characteristics.

Table 2 shows signal samples at sampling times AA, A, T, B, BB, the logical equations belonging thereto and the output signal from the improved early-late phase detector. As shown, the improved detector is able to find signal patterns with pairs of signal values having the same signal levels "high" or "low". The signal transition between adjacent pairs may be high (1) or low (0). In any case, such patterns of signal samples are valuable to control the VCO 10 and therefore are stronger weighted than any other patterns. The circuitry for doing so has already been explained with FIG. 4.

TABLE 1

| Logical Equations | Signal Samples | Output |
| --- | --- | --- |
| A = T AND B/ = T | 001,110 | down = 1 |
|  |  | up = 0 |
| A/ = B AND B = T | 011,100 | up = 1 |
|  |  | down = 0 |
| Others | 000,010,101,111 | up = 0 |
|  |  | down = 0 |

TABLE 2

| Logical Equations | | Sample Groups | Output |
| --- | --- | --- | --- |
| A = T AND B/ = T | A = AA AND B = BB | 00011,11100 | down = x |
| A/ = B AND B = T |  | 00111,11000 | up = x |
| A = T AND B/ = T | A/ = AA OR B/ = BB | 00010,10011,10010, | down = 1 |
|  |  | 11101,01100,01101 |  |
| A/ = B AND B = T |  | 00110,10111,10110 | up = 1 |
|  |  | 11001,01000,01001 |  |
| Others |  | 00000,00001,10000,10001 | up = 0 |
|  |  | 00100,00101,10100,10101 | down = 0 |
|  |  | 01010,01011,11010,11011 |  |
|  |  | 01110,01111,11110,11111 |  |

The invention claimed is:

1. A method for correcting a phase of a clock in a data receiver which receives a data flow representing different signal levels with logical high and low signal values and signal transitions positioned therebetween, comprising the steps of:

evaluating the positions of the signal transitions between respective two adjacent logical signal values for correcting the phase of the clock, wherein the position of a signal transition between a first pair of signal values on a first level, and a second pair of signal values on a second level is weighted stronger in the evaluation than the positions of signal transitions between adjacent single signal values of different signal levels, wherein the method comprises the steps of:

a) sampling the data flow with a clock frequency at four intervals adjacent logical signal values, and at a signal transition positioned between the inner intervals for obtaining a position information of the transition relative to the logical signal values;

b) forming sample groups from said signal samples taken in step a)

c) supplying said sample groups to an early-late phase detector which evaluates said sample groups as to whether the phase of said clock frequency is to be shifted, and outputs a control signal for "frequency UP" "frequency DOWN" or "No control value"

d) examining whether there are pairs of logical signal values on the same level with a signal transition between neighbouring pairs, and e) scaling up said control signal in step c) if the condition under step d) is fulfilled.

* * * * *